US011456130B2

(12) United States Patent
McDonald et al.

(10) Patent No.: US 11,456,130 B2
(45) Date of Patent: Sep. 27, 2022

(54) WALL BOX PROVIDING ADJUSTABLE SUPPORT FOR A CONTROL DEVICE

(71) Applicant: Lutron Technology Company LLC, Coopersburg, PA (US)

(72) Inventors: Matthew P. McDonald, Phoenixville, PA (US); Sean Tucker, Bethlehem, PA (US)

(73) Assignee: LUTRON TECHNOLOGY COMPANY LLC, Coopersburg, PA (US)

( * ) Notice: Subject to any disclaimer, the term of this patent is extended or adjusted under 35 U.S.C. 154(b) by 620 days.

(21) Appl. No.: 16/252,025

(22) Filed: Jan. 18, 2019

(65) Prior Publication Data
US 2019/0252137 A1 Aug. 15, 2019

Related U.S. Application Data

(60) Provisional application No. 62/619,474, filed on Jan. 19, 2018, provisional application No. 62/685,671, filed on Jun. 15, 2018.

(51) Int. Cl.
*H01H 13/04* (2006.01)
*H02G 3/12* (2006.01)
(Continued)

(52) U.S. Cl.
CPC ............ *H01H 13/86* (2013.01); *H01H 13/04* (2013.01); *H01H 13/14* (2013.01); *H02G 3/081* (2013.01);
(Continued)

(58) Field of Classification Search
CPC .......... H02G 3/08; H02G 3/081; H02G 3/086; H02G 3/10; H02G 3/121; H02G 3/12;
(Continued)

(56) References Cited

U.S. PATENT DOCUMENTS 3,885,852 A * 5/1975 Grove ...................... H02G 3/18
439/441
6,566,602 B1 * 5/2003 Miller ..................... H02G 3/121
174/66
(Continued)

FOREIGN PATENT DOCUMENTS

CN 1989669 A 6/2007
CN 1989670 A 6/2007
(Continued)

OTHER PUBLICATIONS

Office Action issued for Canadian Patent Application No. 3,088,743 dated Aug. 19, 2021.
(Continued)

*Primary Examiner* — Angel R Estrada
(74) *Attorney, Agent, or Firm* — Duane Morris LLP

(57) ABSTRACT

A wall box may provide adjustable support for a control device, such as a keypad, to allow for level alignment of the control device when mounted to the wall box. The wall box may have an adjustable support frame to which the control device may be mounted. When the control device is mounted to the support frame of the wall box, the support frame may be rotated to adjust the alignment of the control device. In addition, the wall box may comprise one or more projections configured to be received in respective detents in notched surfaces of the control device to allow for adjustment of the alignment of the control device. Further, the wall box may have a modular assembly and may be constructed from a central portion and two side portions at the time of installation of the wall box.

48 Claims, 16 Drawing Sheets

(51) Int. Cl.
    *H01H 13/86* (2006.01)
    *H02G 3/08* (2006.01)
    *H01H 13/14* (2006.01)
    *H02G 3/10* (2006.01)
    *H05K 5/00* (2006.01)

(52) U.S. Cl.
    CPC ............... *H02G 3/086* (2013.01); *H02G 3/10* (2013.01); *H02G 3/121* (2013.01); *H05K 5/0008* (2013.01)

(58) Field of Classification Search
    CPC .......... H02G 3/123; H02G 3/14; H01H 13/86; H01H 13/04; H01H 13/08; H05K 5/0008; H05K 5/00; H05K 5/02
    USPC ....... 174/480, 481, 50, 53, 57, 58, 17 R, 66, 174/67; 220/3.2–3.9, 4.02; 248/906
    See application file for complete search history.

(56) References Cited

U.S. PATENT DOCUMENTS

| | | | |
|---|---|---|---|
| 7,820,912 B1 * | 10/2010 | Shotey | H02G 3/12 174/67 |
| 8,575,497 B2 * | 11/2013 | Hultgreen | F25D 29/005 174/50 |
| 9,095,053 B2 * | 7/2015 | Trolese | H02G 3/14 |
| 9,568,356 B2 | 2/2017 | Sloan et al. | |
| 2006/0124337 A1 | 6/2006 | Schmieta et al. | |
| 2013/0277086 A1 | 10/2013 | Rohmer | |
| 2014/0268630 A1 | 9/2014 | Samuels et al. | |
| 2015/0075836 A1 | 3/2015 | Smith et al. | |
| 2016/0020590 A1 | 1/2016 | Philipp et al. | |
| 2016/0197439 A1 | 7/2016 | Mizrahi et al. | |
| 2016/0307714 A1 | 10/2016 | Bhate et al. | |

FOREIGN PATENT DOCUMENTS

| | | |
|---|---|---|
| CN | 105449440 A | 3/2016 |
| CN | 107534250 A | 1/2018 |
| EP | 2615708 A1 | 7/2013 |
| FR | 3013159 A1 | 5/2015 |
| WO | 2005117223 A1 | 12/2005 |
| WO | 2005117226 A2 | 12/2005 |
| WO | 2016112014 A1 | 7/2016 |

OTHER PUBLICATIONS

Office Action issued for Chinese Patent Application No. 201980013772.X dated Aug. 9, 2021.

Office Action dated Mar. 31, 2022 for corresponding European Patent Application No. 19703592.6, 11 pages.

Office Action dated Apr. 27, 2022 for corresponding Chinese Patent Application No. 201980013772.X, 12 pages.

* cited by examiner

WALL BOX PROVIDING ADJUSTABLE SUPPORT FOR A CONTROL DEVICE

CROSS-REFERENCE TO RELATED APPLICATIONS

This application claims the benefit of U.S. Provisional Patent Application No. 62/619,474, filed Jan. 19, 2018, and U.S. Provisional Patent Application No. 62/685,671, filed Jun. 15, 2018, the entire disclosures of which are hereby incorporated by reference.

BACKGROUND

Electrical wall boxes are well known. A typical electrical wall box includes a housing that is installed within an opening in a wall. An electrical wall box is typically configured to receive at least one electrical device, such as a switch or a receptacle, for example. A typical electrical wall box is also configured to receive a wall plate (e.g., a faceplate). The wall plate may be adapted to cover a yoke plate and/or escutcheon of the electrical devices mounted within the wall box. The wall plate may be configured to be attached to the electrical device with or without fasteners. If the wall box is installed in the opening in the wall at an angle when the electrical device is mounted to the wall box, the electrical device and/or the wall plate may also appear crooked on the wall, which may be an undesirable installation condition.

SUMMARY

As described herein, a wall box may provide adjustable support for an electrical device to allow for level alignment of the electrical device after installation of the electrical device in the wall box. The electrical device may comprise a control device, such as a wall-mounted keypad for controlling the amount of power delivered to one or more electrical loads (e.g., lighting loads), for example, as part of a load control system. The wall box may define a recess for receiving an enclosure of the electrical device.

The wall box may have a support frame to which the control device may be mounted. For example, the support frame may comprise tabs to which respective snaps of the electrical device may engage to connect the electrical device to the support frame. When the control device is mounted to the support frame of the wall box, the support frame may be rotated to adjust the alignment of the control device. The support frame may be configured to be locked in place after the support frame is rotated to align the electrical device after installation. For example, the wall box may comprise a locking screw that may be received through a slot in the support frame and may have a terminal end received in the body of the wall box. The support frame may be configured to be rotated when the locking screw is loosened and locked in place when the locking screw is tightened.

The support frame may comprise opposing planar portions oriented in a first plane and opposing spanning portions connected between the planar portions to define an opening of the support frame. The planar portions of the support frame may be captured between parts formed in the body of the wall box for allowing the planar portions to slide between the parts and facilitating rotation of the support frame in the first plane of the planar portions. The spanning portions of the support frame may be oriented in a second plane perpendicular to the first place of the planar portions, and may be configured to contact the enclosure of the electrical device when the electrical device is connected to the support frame to hold the electrical device in the recess of the wall box.

In addition, the wall box may comprise at least one flexible member having a projection configured to be received in one of a plurality of detents in a notched surface of the control device to allow for adjustment of the alignment of the electrical device. The flexible member may be configured to flex as the electrical device is rotated to allow the projection to be received in other ones of the plurality of detents of the notched surface. For example, the wall box may comprise two flexible members having respective projections at a top side of the wall box and two flexible members having respective projections at a bottom side of the wall box. The projections at the top side of the wall box may be configured to engage respective detents of the notched surface at the top side of the enclosure, and the projections at the bottom side of the wall box may be configured to engage respective detents of the notched surface at the bottom side of the enclosure.

Further, a wall box having a modular assembly is described herein. The wall box may be constructed from a central portion and two side portions at the time of installation of the wall box (e.g., in the field). The side portions may be connected to the center portion to define a recess configured to receive an enclosure of an electrical device. The center portion may define a top side, a bottom side, and a rear side of the wall box, while the side portions may define the left and right sides of the wall box. Each side portion may comprise a first attachment configuration and a second attachment configuration. The center portion may comprise one of the first attachment configurations and one of the second attachment configurations on each side of the center portion. The first attachment configurations of each of the side portions may be configured to be attached to one of the second attachment configurations of the center portion. The second attachment configurations of each of the side portions may be configured to be attached to one of the first attachment configurations of the center portion.

DETAILED DESCRIPTION

Figure 1:
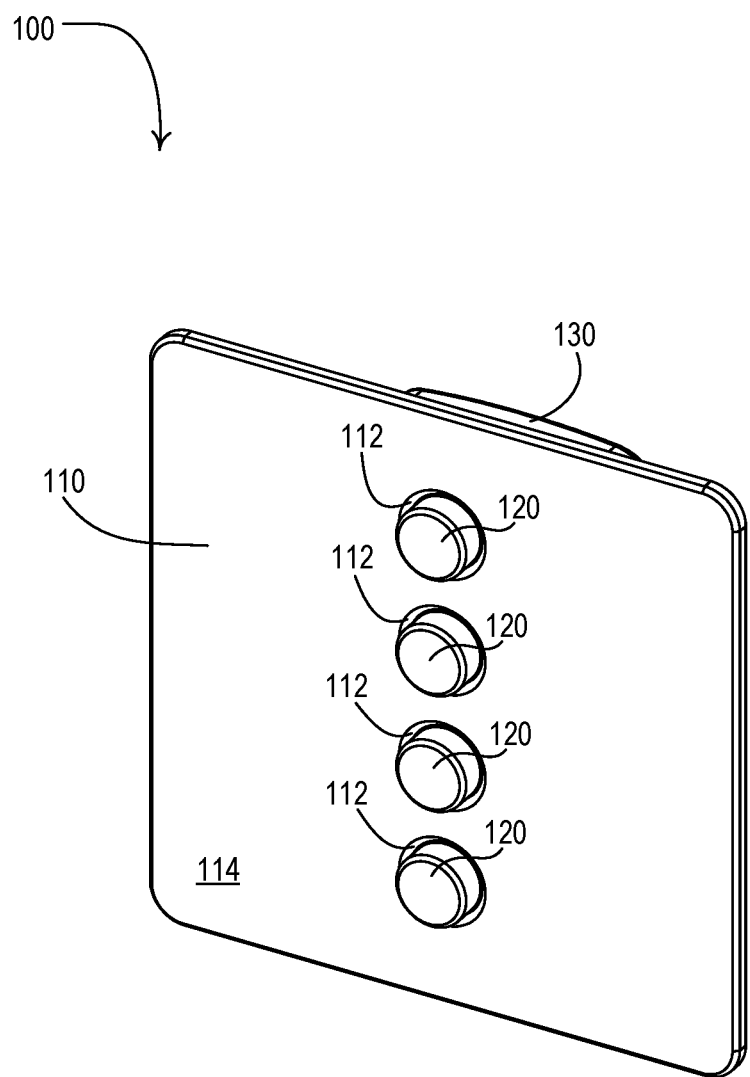
FIG. 1 is a perspective view of an example control device (e.g., a wall-mounted keypad) for use in a load control system for controlling the amount of power delivered to one or more electrical loads.
Figure 2:
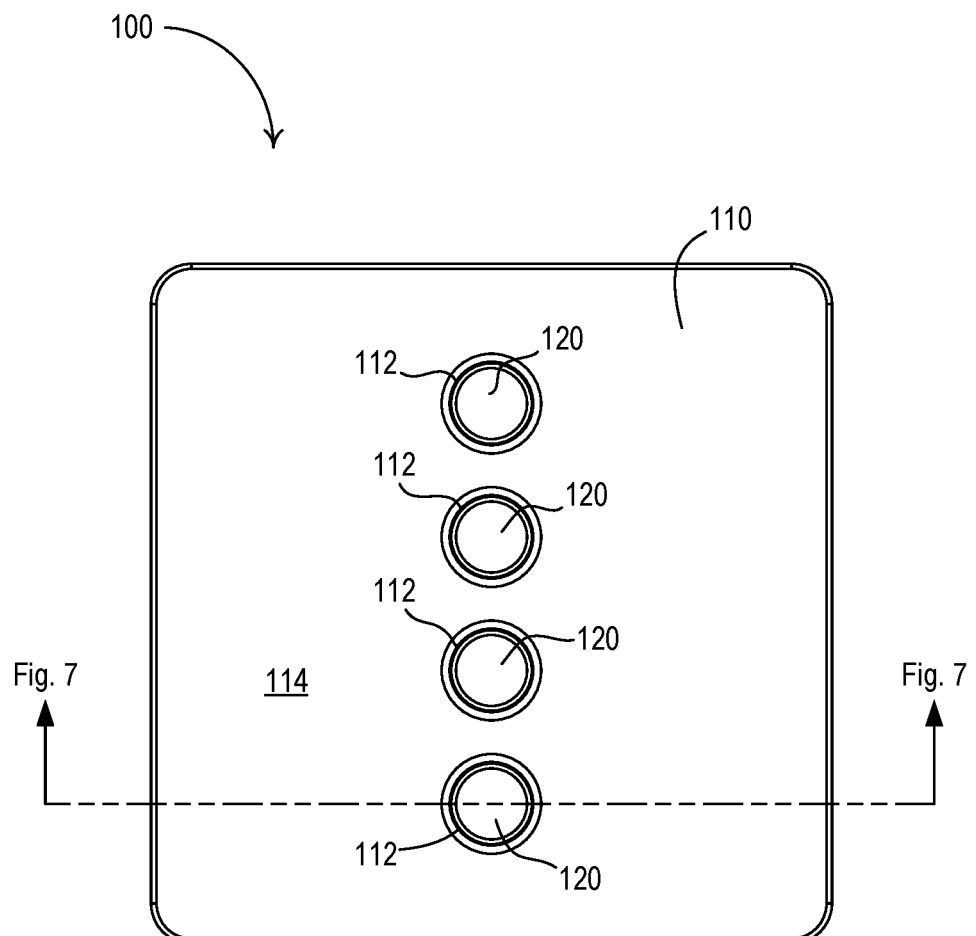
FIG. 2 is a front view of the control device of FIG. 1.

FIG. 1 is a perspective view and FIG. 2 is a front view of an example electrical device, e.g., a control device, such as a wall-mounted keypad 100 for controlling the amount of power delivered to one or more electrical loads (e.g., lighting loads), for example, as part of a load control system. The keypad 100 may comprise a faceplate 110 and one or more buttons 120 received through respective openings 112 of the faceplate 110.

In response to an actuation of one or more of the buttons 120, the keypad 100 may be configured to cause the electrical loads to be controlled, for example, to turn the electrical loads on and off and/or the adjust the amount of power delivered to the electrical loads (e.g., dimming control). For example, the keypad 100 may transmit a digital message to one or more external load control devices (e.g., dimmers, light-emitting diode drivers, motorized window treatments, thermostats, system controllers, etc.) via a communication link for controlling respective electrical loads in response to an actuation of one of the buttons 120. The communication link may comprise a wired communication link or a wireless communication link, such as a radio-frequency (RF) communication link. Alternatively or additionally, the keypad 100 may comprise an internal load control circuit for controlling the power delivered to one or more electrical loads (e.g., electrically coupled to the keypad), and may be configured to control the internal load control circuit in response to an actuation of one of the buttons 120. Examples of load control systems having remote control devices, such as the keypad 100, are described in greater detail in commonly-assigned U.S. Pat. No. 6,803,728, issued Oct. 12, 2004, entitled SYSTEM FOR CONTROL OF DEVICES, and U.S. Pat. No. 9,553,451, issued Jan. 24, 2017, entitled LOAD CONTROL SYSTEM HAVING INDEPENDENTLY-CONTROLLED UNITS RESPONSIVE TO A BROADCAST CONTROLLER, the entire disclosures of which are hereby incorporated by reference.

Actuations of the buttons 120 may cause the keypad 100 to control the electrical load according to respective commands (e.g., predetermined and/or preprogrammed commands). For example, the keypad 100 may comprise an on button for turning on the electrical load, an off button for turning off the electrical load, a raise button for increasing the amount of power delivered to the electrical load, and/or a lower button for decreasing the amount of power delivered to the electrical load. In addition, actuations of the buttons 120 may recall respective presets (e.g., predetermined and/or preprogrammed presets or scenes), which may cause one or more electrical loads to be controlled to different power levels as set by the presets. The buttons 120 may each comprise indicia (not shown), such as text or icons, for indicating the command and/or preset that may be selected in response to an actuation of the respective button. Additionally or alternatively, the faceplate 110 may have indicia on a front surface 114 of the faceplate adjacent to each of the buttons 120 for indicating the command and/or preset that may be selected in response to an actuation of the respective button.

Figure 3:
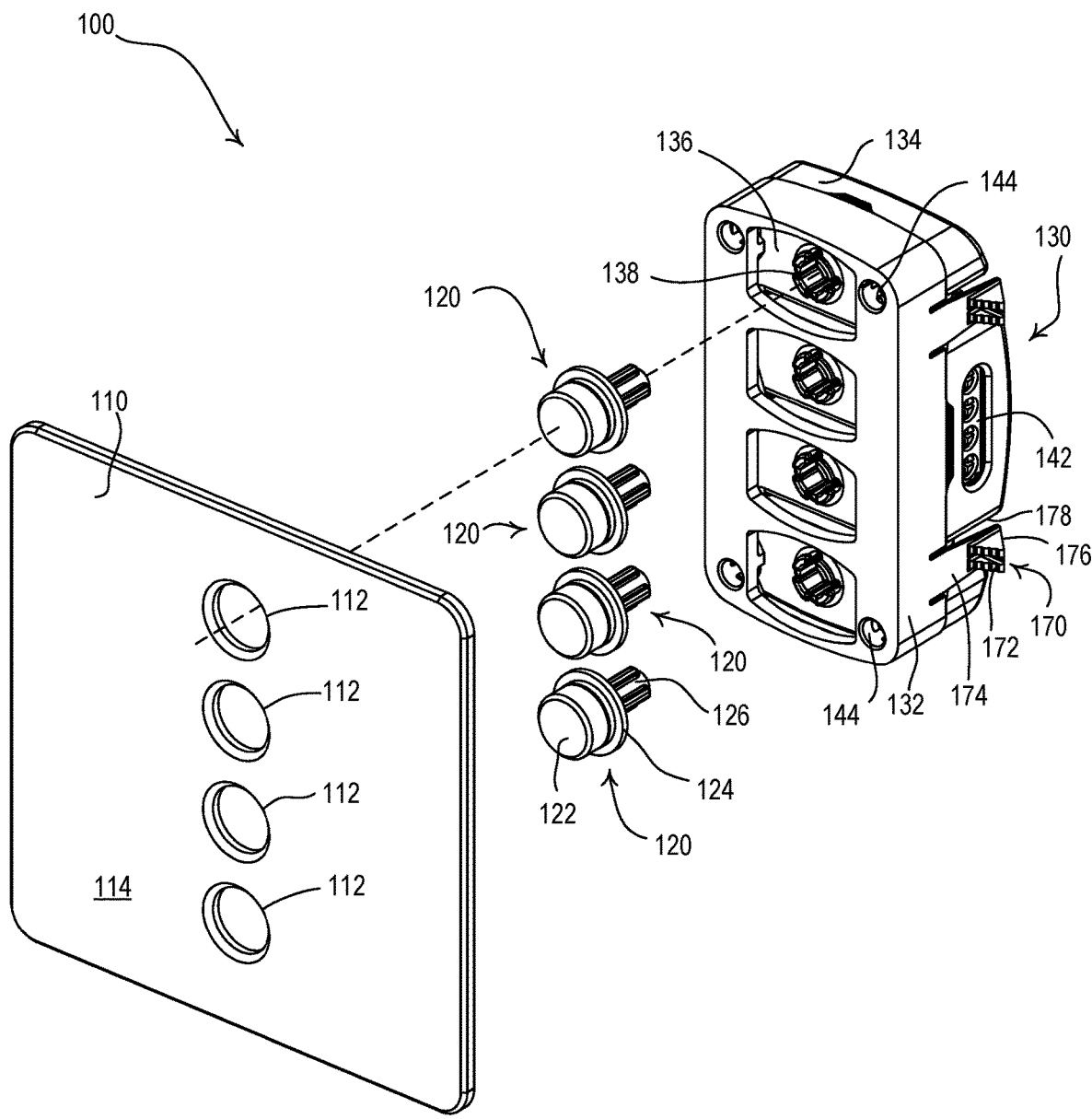
FIG. 3 is an example front exploded view of the control device of FIG. 1.
Figure 4:
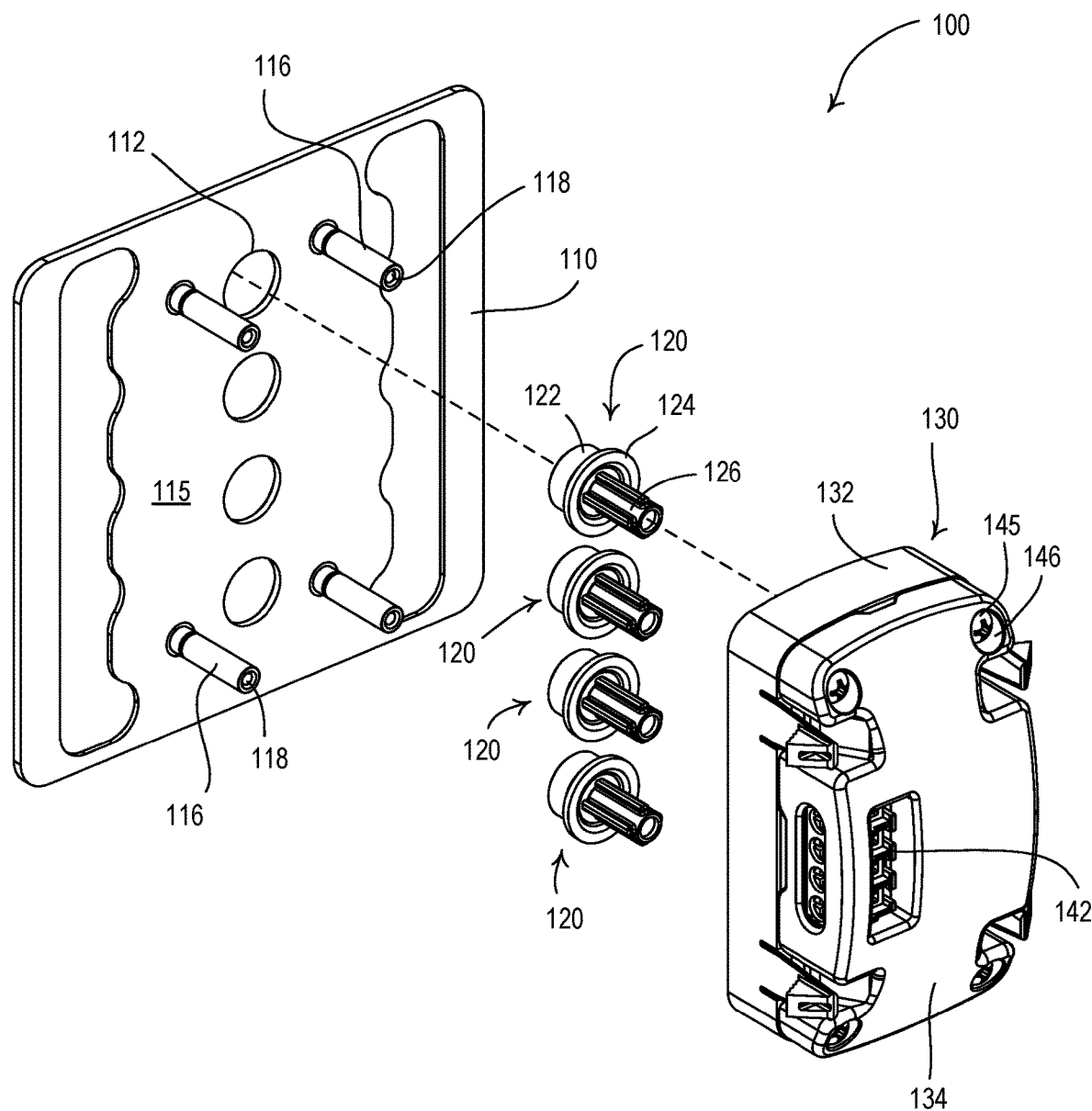
FIG. 4 is an example rear exploded view of the control device of FIG. 1.

FIG. 3 is an example front exploded view and FIG. 4 is an example rear exploded view of the keypad 100. The keypad 100 may comprise a control module 130, which may include electrical circuitry of the keypad. The control module 130 may be connected (e.g., directly connected) to a rear surface 115 of the faceplate 110. The control module 130 may comprise an enclosure having a front enclosure portion 132, a rear enclosure portion 134, and a carrier 136 (e.g., a button support structure). The control module 130 may comprise a printed circuit board 140 (FIG. 7) mounted between the front enclosure portion 132 and the rear enclosure portion 134. The electrical circuitry of the keypad 100 may be mounted to the printed circuit board 140. The control module 130 may comprise a connector 142 that may allow the control module to be electrically connected to a power source and/or a wired communication link (e.g., digital communication link and/or an analog control link).

The buttons 120 may each comprise a cap portion 122, a flange portion 124, and an elongated portion 126. The elongated portion 126 of each button may be received in respective openings 138 of the carrier 136 of the control module 130. When the faceplate 110 is connected to the control module 130, the cap portion 122 of each of the buttons 120 may be received in the respective opening 112 of the faceplate 110. The flange portions 124 may cause the buttons 120 to be captured between the faceplate 110 and the control module 130. The faceplate 110 may comprise posts 116 that extend from the rear surface 115 of the faceplate 110, and may be received in openings 144 in the front enclosure portion 132. The faceplate 110 may be attached to the control module 130 via attachment screws 145 received through openings 146 in the rear enclosure portion 134 and openings 118 (e.g., threaded openings) in the posts 116 of the faceplate when the posts are located in the openings 144 of the front enclosure portion 132.

When the faceplate 110 is attached to the control module 130 and the cap portion 122 of each button 120 is received in the respective opening 112 in the faceplate 110, the cap portion 122 of each button 120 may be actuated (e.g., pushed in towards the control module 130) to cause the elongated portion 126 of the button 120 to actuate mechanical switches inside the control module 130. The mechanical switches of the control module 130 may each comprise a deflectable dome 148 (FIG. 7) that may contact the elongated portion 126 of the respective button 120. When the button 120 is pushed in towards the control module 130, the dome 148 may be configured to flex so that at least a conductive portion of the dome 148 may contact the printed circuit board 140, which may short out electrical traces on the printed circuit board and indicate the actuation of the button to a control circuit (not shown) of the keypad 100. Examples of keypads having mechanical switches that include deflectable domes are described in greater detail in commonly-assigned U.S. Pat. No. 10,181,385, issued Jan. 15, 2019, entitled CONTROL DEVICES HAVING INDEPENDENTLY SUSPENDED BUTTONS FOR CONTROLLED ACTUATION, the entire disclosure of which is hereby incorporated by reference. Additionally or alternatively, the mechanical switches of the control module 130 may comprise mechanical tactile switch packages mounted to the printed circuit board 140 and/or another type of switching mechanism and/or circuit.

Figure 5:
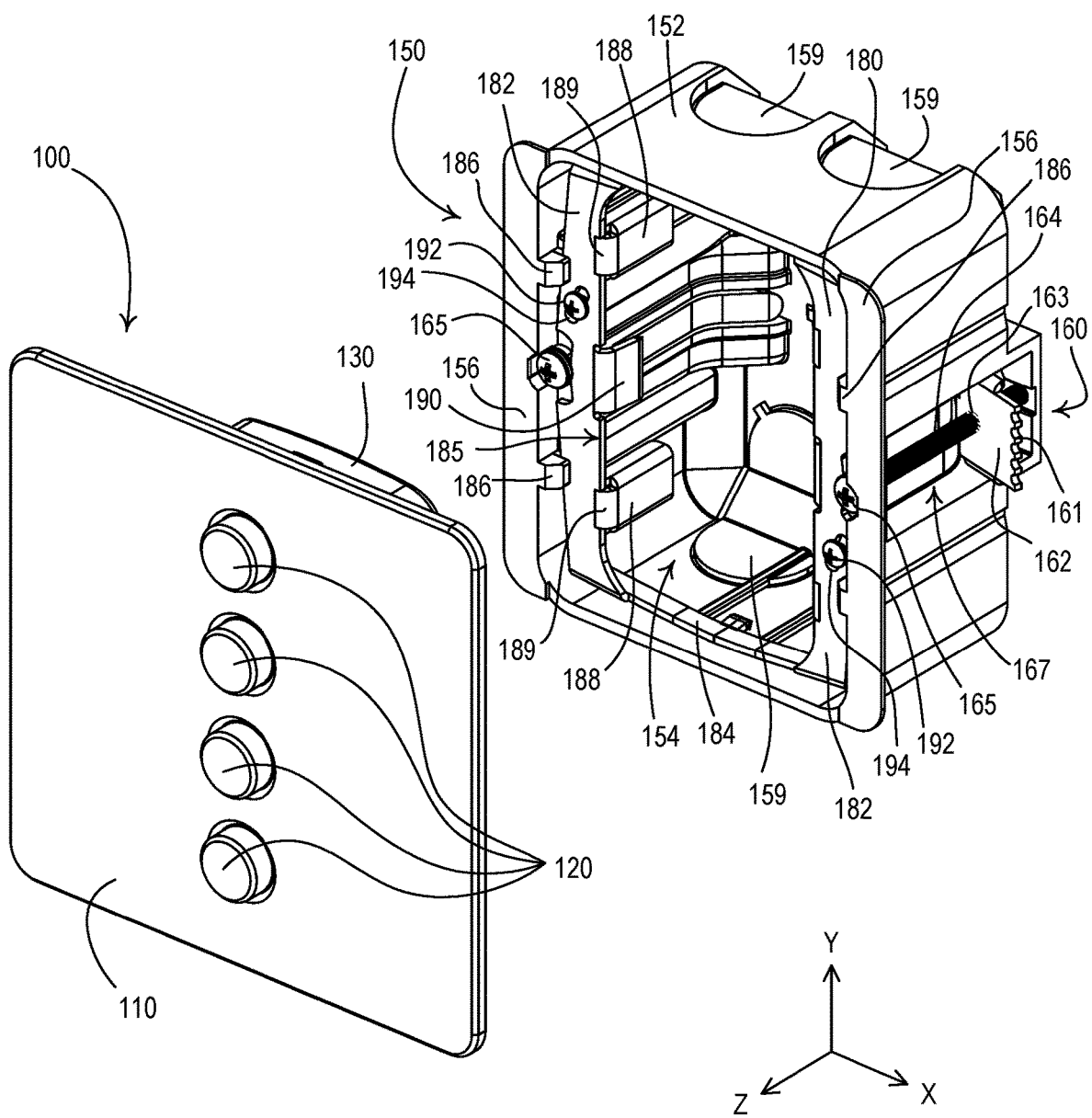
FIG. 5 is an example front exploded view showing the control device of FIG. 1 detached from a wall box.
Figure 6:
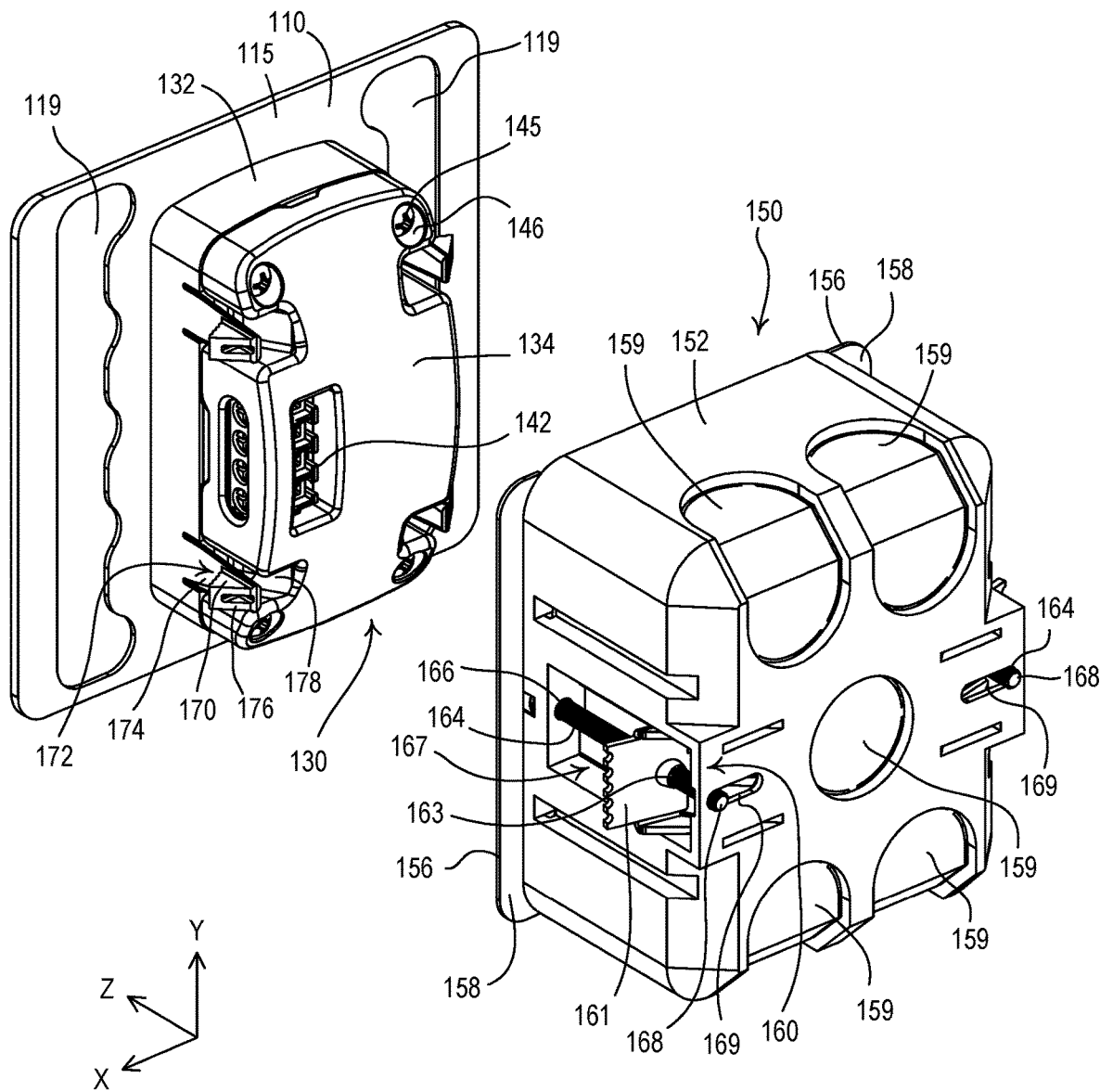
FIG. 6 is an example rear exploded view of the control device and wall box of FIG. 5.
Figure 7:
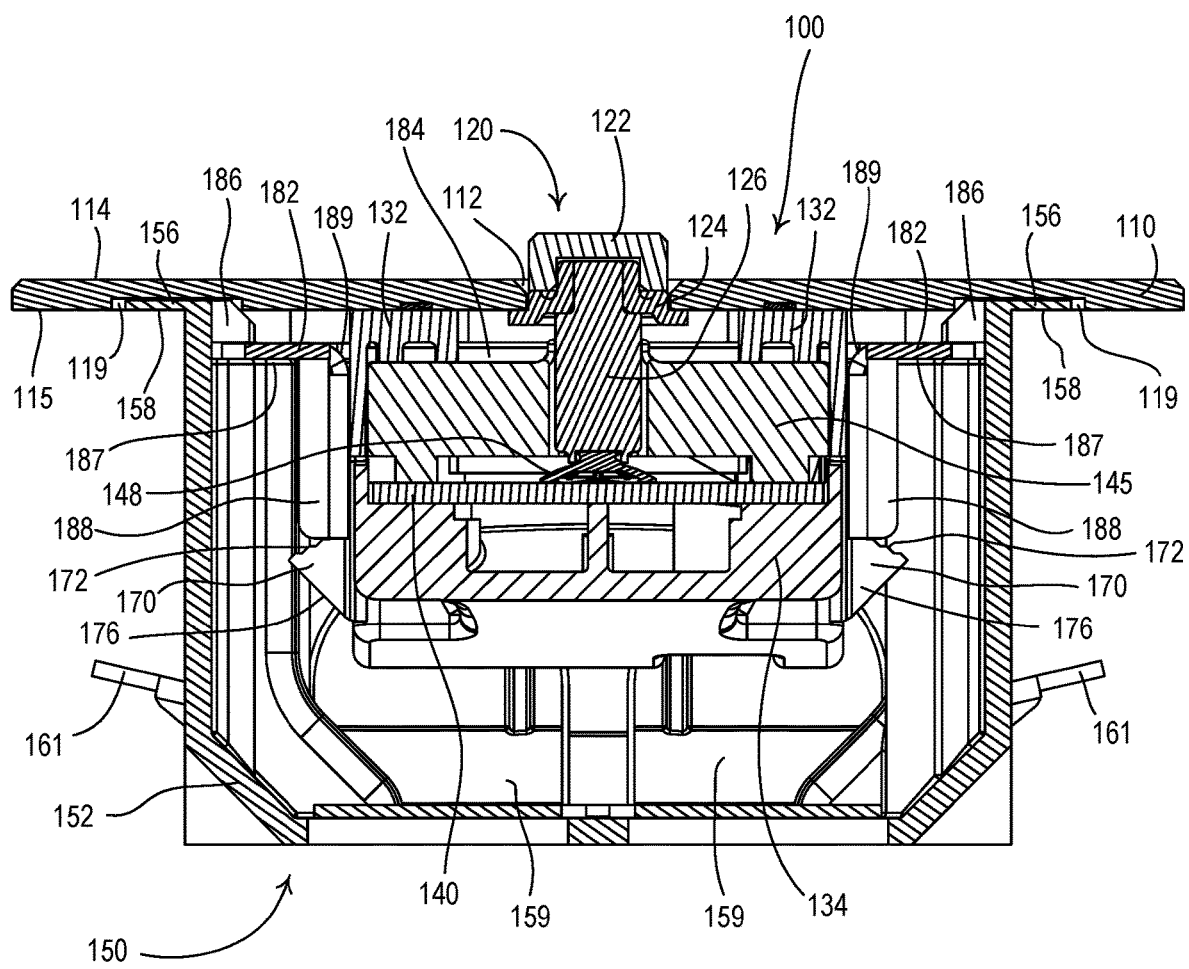
FIG. 7 is an example bottom cross-sectional view of the control device of FIG. 1 taken through the center of a button of the control device when the control device is mounted to the wall box of FIG. 5.

The keypad 100 may be configured to be mounted to a wall box 150 (e.g., an electrical wall box). FIG. 5 is an example front perspective view and FIG. 6 is an example rear perspective view showing the keypad 100 detached from the wall box 150. FIG. 7 is a bottom cross-sectional view of the keypad 100 and the wall box 150 taken through the center of one of the buttons 120 (e.g., the bottom button as shown in FIG. 2) when the keypad is mounted to the wall box. The wall box 150 may comprise a body 152 that defines a recess 154 configured to receive the control module 130 of the keypad 100 (e.g., the enclosure of the control module) or another wall-mounted electrical device. The wall box 150 may be configured to be inserted within an opening in a wall (e.g., such as drywall, plaster, wood paneling, etc.). The wall box 150 may further comprise a flange 156 that at least partially surrounds the recess 154 of the body 152. The flange 156 may comprise a rear surface 158 that may be configured to abut against the wall when the wall box 150 is inserted into the opening in the wall. When the keypad 100 is mounted to the wall box 150 and the faceplate 110 is attached to the control module 130, the flanges 156 may be received in recesses 119 in the rear surface 115 of the faceplate so that the rear surface of the faceplate may sit against the wall (e.g., a space between the rear surface 115 of the faceplate 110 and the wall may be minimized and/or eliminated). The wall box 150 may include one or more knock-outs 159 that may be removed and/or partially removed to create openings in the wall box through which one or more electrical wires and/or communication wires (e.g., that may be connected to the connector 140 of the keypad 100) may extend.

The wall box 150 may include mounting clamps 160 (e.g., two mounting clamps) that may be used to mount the wall box 150 to the wall. Each mounting clamp 160 may include a plate 161 defining a front surface 162 and a bore 163 running therethrough. The front surface 162 may be configured to abut the wall (e.g., the opposite wall surface than the flange 156 engages). The bore 163 of the plate 161 of each mounting clamp 160 may receive a respective mounting screw 164 and may be threaded onto the mounting screw 164. Each mounting screw 164 may have a head 165 that may be maintained at a location adjacent to the flange 156 (e.g., at the front) of the electrical wall box 150. Each mounting screw 164 may extend through an opening 166 in the body 152 (e.g., adjacent to the flange 156). Each mounting screw 164 may extend through a respective channel 167 that is formed in the body 152 of the wall box 150. Each mounting screw 164 may have a terminal end 168 opposite the head 165 that may be positioned in a slot 169 formed in the body 152 of the wall box 150. In addition, the wall box 150 may be mounted to (e.g., nailed to) a stud or other structure before the wall is installed.

To insert the wall box 150 into the opening in the wall, the terminal ends 168 of the mounting screws 164 may be moved through the slots 169 to locate the plates 161 within the channels 167 (e.g., the mounting clamps 160 may not extend beyond an outer periphery of the body 152 of the wall box 150). Thus, the wall box 150 may be configured to be inserted into the opening in the wall when the plates 161 of the mounting clamps 160 are located in the channels 167. To mount the wall box 150 to the wall after the wall box 150 is inserted into the opening in the wall, the heads 165 of the mounting screws 164 may be driven with a screwdriver which may cause the plates 161 of the mounting clamps 160 to move through the respective channel 167 towards the flange 156 at the front of wall box 150, for example, in response to continued rotation of the head 165 of the mounting screw 164. The mounting clamps 160 may clamp the wall box 150 to the wall when the front surface 162 of the plate 161 abuts the opposite side of the wall as the rear surface 158 of the flange 156.

The keypad 100 may be configured to mount to (e.g., snap to) the wall box 150, for example, without using screws. The control module 130 may comprise snaps 170 configured to snap to a support frame 180 of the wall box 150. The support frame 180 may comprise two opposing planar portions 182 (e.g., that may be located in a plane oriented along the x-axis and the y-axis as shown in FIG. 5). The planar portions 182 may be connected together via two opposing spanning portions 184 that may be perpendicular to the planar portions 182 (e.g., extending in planes oriented along the y-axis and the z-axis). The planar portions 182 and the spanning portions 184 may define an opening 185 through which the enclosure of the keypad 100 may be received. The planar portions 182 may be captured between parts of the wall box, such as projections 186 and ledges 187 (FIG. 9), formed in the body 152 of the wall box 150 to hold the support frame 180 inside the recess 154 of the wall box 150.

The support frame 180 may comprise tabs 188 that extend into the recess 154 of the wall box 150. The snaps 170 may be configured to engage the tabs 188 of the support frame 180 when the keypad 100 is inserted into the recess 154 of the wall box 150. The snaps 170 may each comprise an engagement surface 172 configured to engage the respective tab 188 of the support structure 180. The engagement surface 172 may each comprise a number of steps that may engage the respective tab 188 to provide a number of different levels of insertion of the control module 130 into the recess 154 of the wall box 150 (e.g., depending upon how far the control module 130 is able to be inserted into the recess of the wall box). The snaps 170 may be connected (e.g., flexibly connected) to the front enclosure portion 132 of the control module 130 via arms 174. As the keypad 100 is inserted into the recess 154 of the wall box 150, sloped surfaces 176 of the snaps 170 may push against front surfaces 189 of the tabs 188. This may cause the arms 174 to flex forcing the snaps 170 into respective channels 178 formed in the rear enclosure portion 134 of the control module 130. When the snaps 170 move past terminal ends of the tabs 188, the arms 174 may return to their idle positions and the snaps 170 may engage the tabs 188 thus holding the keypad 100 inside of the recess 154 of the wall box 150. The keypad 100 may be removed from the wall box 150 by pulling the faceplate 110 away from the wall box until the arms 174 flex to force the snaps 170 into the respective channels 178 thus allowing the control module 130 to exit the recess 154 of the wall box 150.

The support frame 180 may also comprise springs 190 configured to squeeze the sides of the front enclosure portion 132 and/or the rear enclosure portion 134 to hold the control module 130 in the recess 154 of the wall box 150. The spanning portions 184 of the support frame 180 may also be configured to contact the top and bottom of the front enclosure portion 132 and/or the rear enclosure portion 134 to hold the control module 130 in the recess 154 of the wall box 150.

Figure 8:
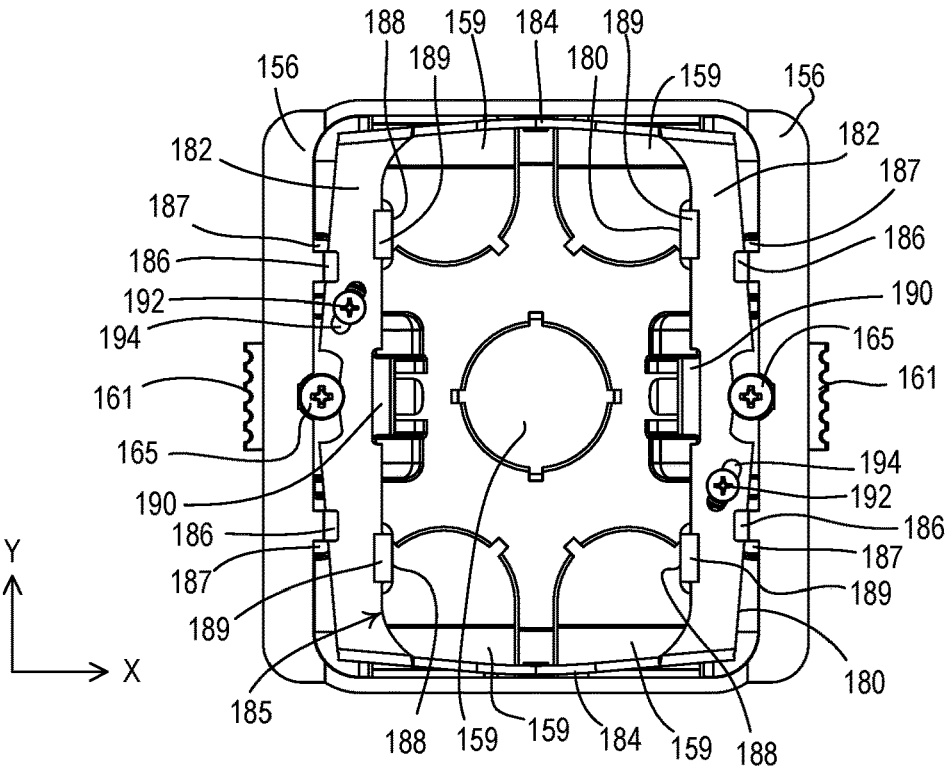
FIG. 8 is an example front view of the wall box of FIG. 5 with the wall box mounted straight and a mounting frame of the wall box centered in the wall box.
Figure 9:
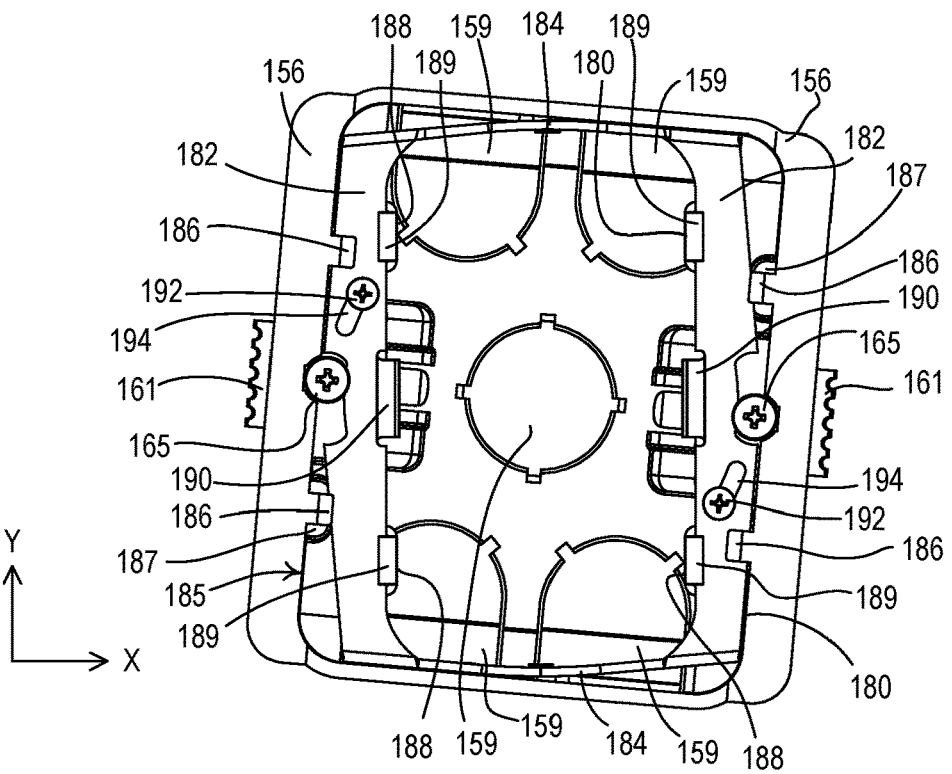
FIG. 9 is an example front view of the wall box of FIG. 8 with the wall box mounted crooked and the mounting frame adjusted so that the keypad may be level on the wall.

FIG. 8 is a front view of the wall box 150 with the wall box mounted straight and the mounting frame 180 centered in the wall box. If the wall box 150 is installed in the opening in the wall at an angle when the keypad 100 is mounted to the wall box 150, the keypad 100 may also appear crooked on the wall, which may be an undesirable installation condition. The support frame 180 may be configured to move (e.g., rotate) so that the alignment (e.g., angle) of the keypad 100 on the wall may be adjusted and the keypad 100 may be arranged substantially level. FIG. 9 is a front view of the wall box 150 with the wall box mounted crooked and the mounting frame 180 adjusted so that the keypad 100 may be level on the wall. The planar portions 182 of the support frame 180 may be configured to slide between the projections 186 and the ledges 187 to move (e.g., rotate) in the x-y plane.

After the wall box 150 is mounted in the opening in the wall, the keypad 100 may be mounted to the support frame 180, and the keypad 100 and the support frame 180 may be adjusted (e.g., in the x-y plane) until the keypad 100 is level. The support frame 180 may then be locked in position. For example, the wall box 150 may comprise locking screws 192 received through slots 194 in the planar portions 182 of the support frame 180. The locking screws 192 may have terminal ends (not shown) received in the body 152 of the wall box 150. When the locking screws 192 are loosened, the support frame 180 may be rotated so that the locking screws move through the slots 192 in the planar portion 182. The slots 192 may be characterized by a slight curvature to facilitate rotation of the support frame 180 about an axis that may be located at the center of the support frame. When the support frame 180 is in the correct position, the locking screws 192 may be tightened to lock the support frame 180 in place. The wall box 150 may comprise other locking mechanisms for locking the support frame 180 in place.

Figure 10:
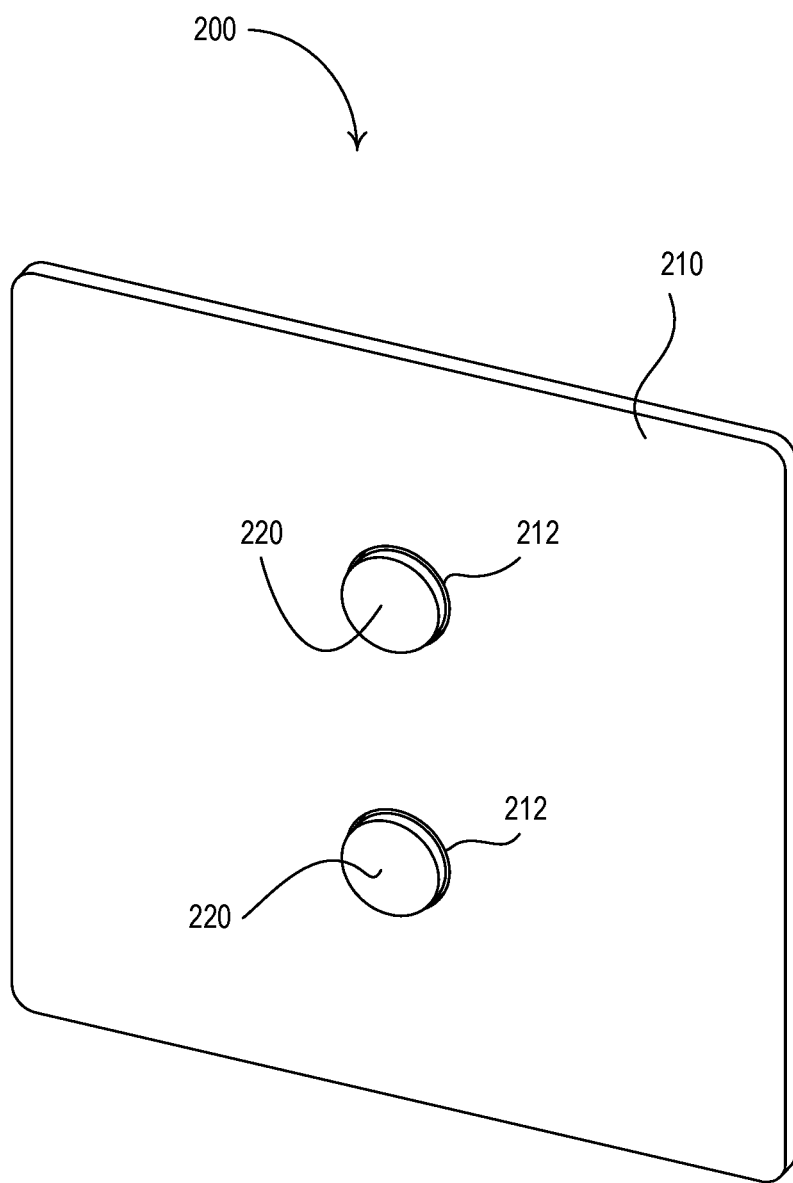
FIG. 10 is a perspective view of another example control device (e.g., a wall-mounted keypad) for use in a load
Figure 11:
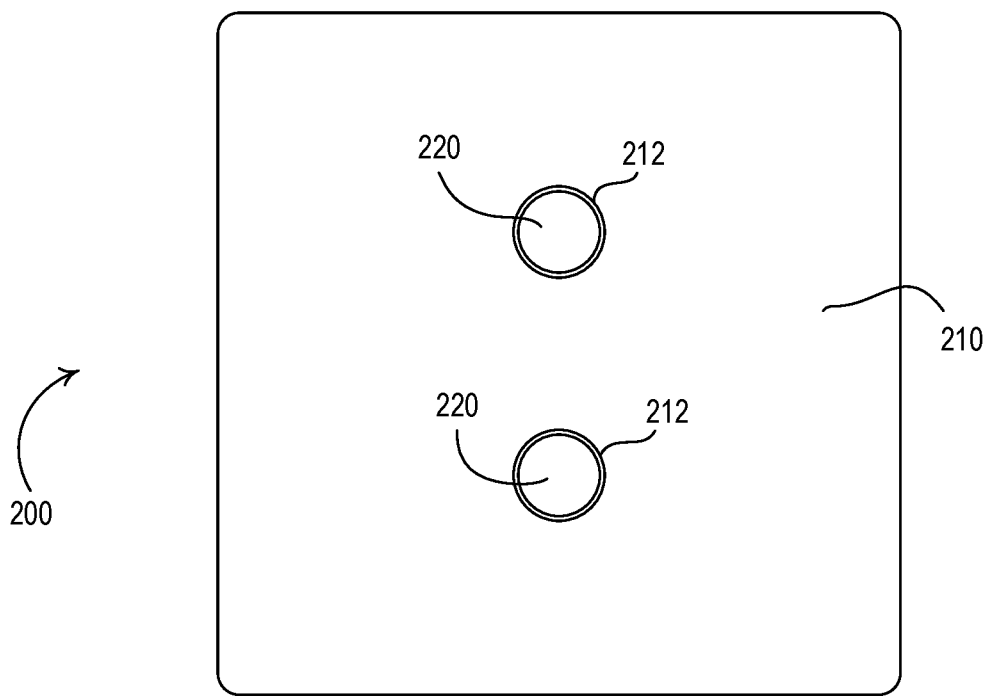
FIG. 11 is a front view of the control device of FIG. 10.
Figure 12:
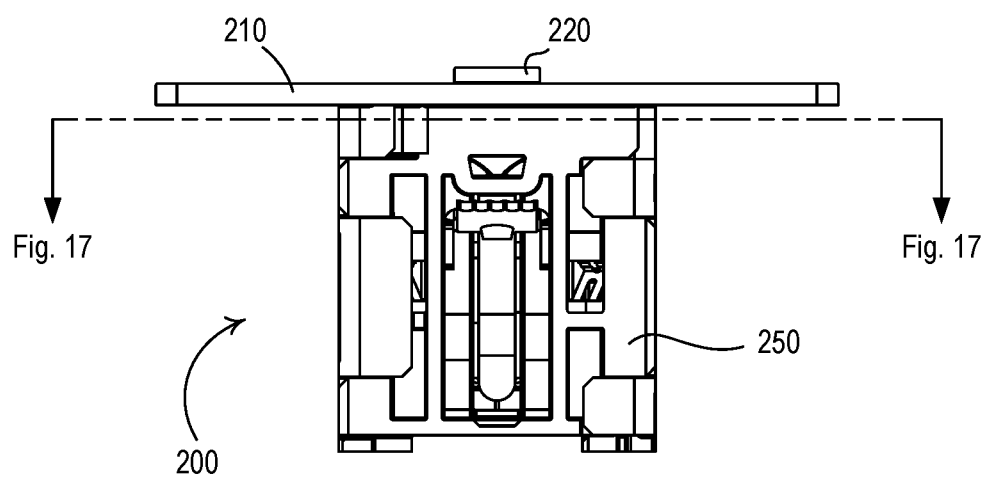
FIG. 12 is a bottom view of the control device of FIG. 10.

FIGS. 10-18 illustrate another example electrical device, e.g., a control device, such as a wall-mounted keypad 200 for controlling the amount of power delivered to one or more electrical loads (e.g., lighting loads). The keypad 200 may have many of the same elements and features as the keypad 100 and wall box 150 shown in FIGS. 1-9. The keypad 200 may be installed in a wall box 250. FIG. 10 is a perspective view and FIG. 11 is a front view of the keypad 200. FIG. 12 is a bottom view of the keypad 200 and the wall box 250. The keypad 200 may comprise a faceplate 210 and one or more buttons 220 received through respective openings 212 in a front surface 214 of the faceplate 210.

The keypad 200 may be configured to cause the electrical loads to be controlled (e.g., to turn the electrical loads on and off and/or the adjust the amount of power delivered to the electrical loads) in response to an actuation of one or more of the buttons 220. For example, the keypad 200 may transmit a digital message to one or more external load control devices via a communication link (e.g., a wired or wireless communication link) for controlling respective electrical loads in response to an actuation of one of the buttons 220. Alternatively or additionally, the keypad 200 may comprise an internal load control circuit for controlling the power delivered to one or more electrical loads (e.g., electrically coupled to the keypad), and may be configured to control the internal load control circuit in response to an actuation of one of the buttons 220. Actuations of the buttons 220 may cause the keypad 200 to control the electrical load according to respective commands (e.g., predetermined and/or preprogrammed commands). For example, actuations of the buttons 220 of the keypad 200 may cause the one or more electrical loads to be controlled according to predetermined and/or preprogrammed commands (e.g., to turn on or off, and/or to adjust the amount of power delivered to the electrical load) and/or according to predetermined and/or preprogrammed presets (e.g., predetermined and/or preprogrammed scenes).

Figure 13:
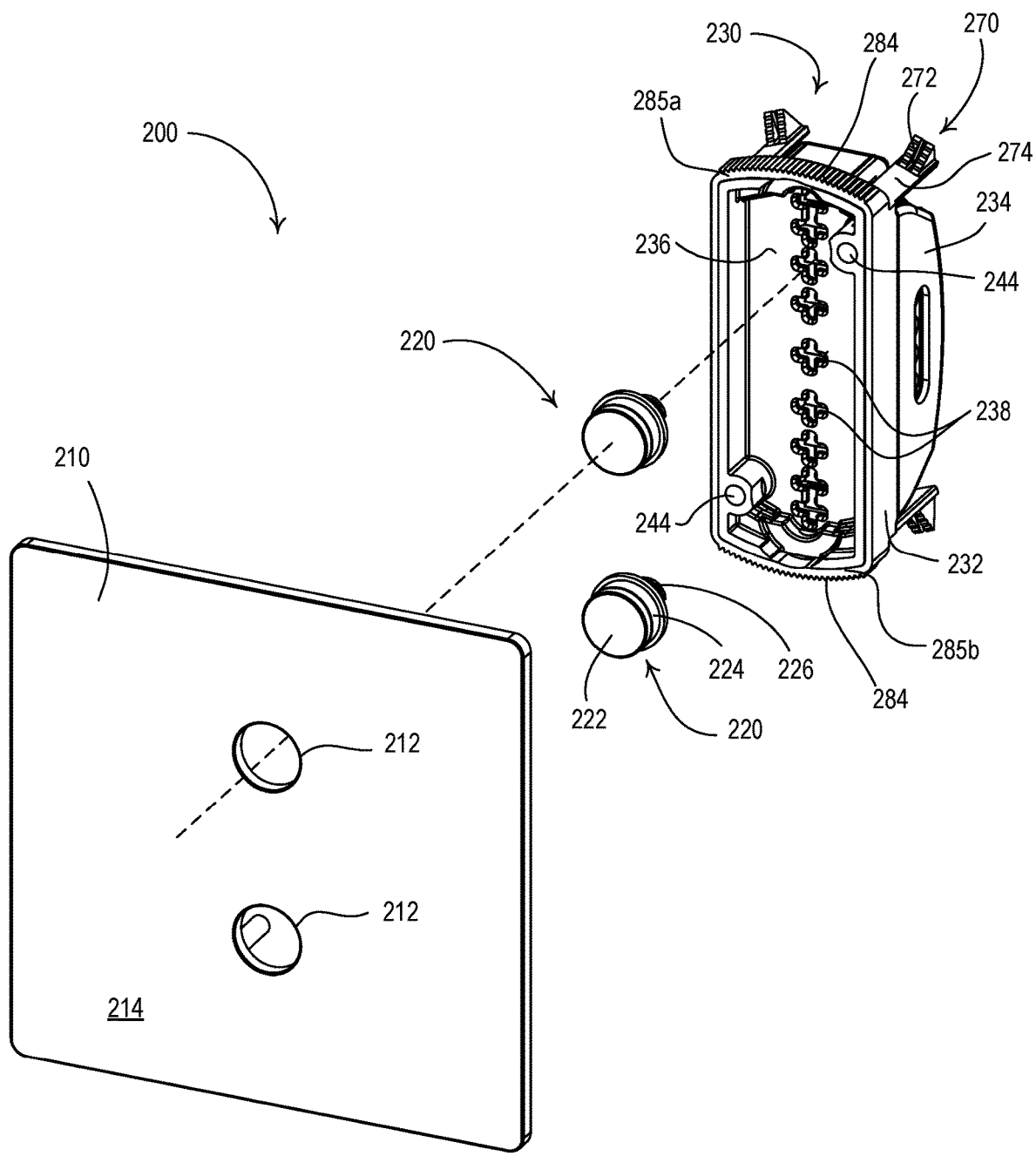
FIG. 13 is an example front exploded view of the control device of FIG. 10.
Figure 14:
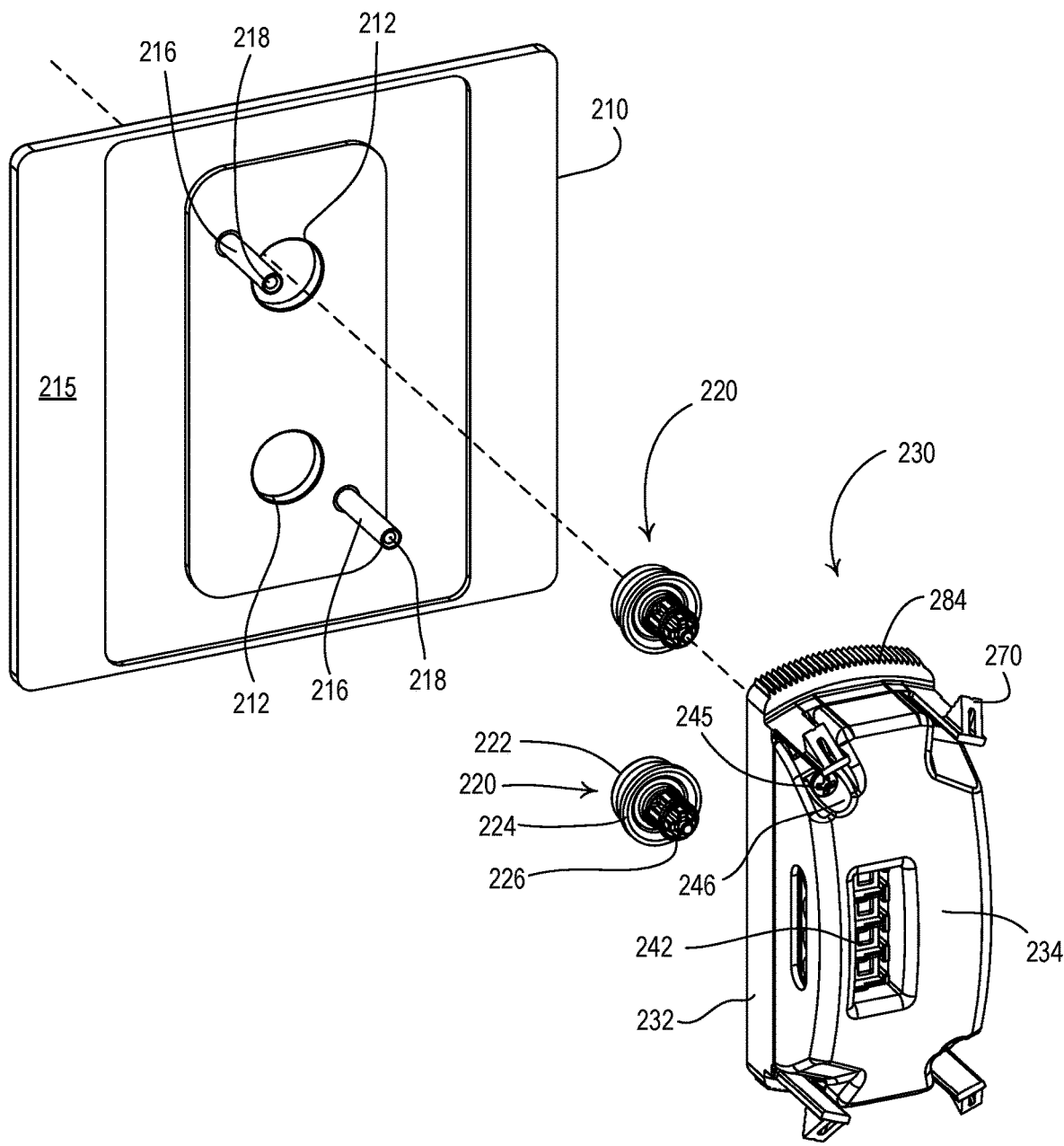
FIG. 14 is an example rear exploded view of the control device of FIG. 10.

FIG. 13 is an example front exploded view and FIG. 14 is an example rear exploded view of the keypad 200. The keypad 200 may comprise a control module 230 that may include electrical circuitry of the keypad and may be connected (e.g., directly connected) to a rear surface 215 of the faceplate 210. The control module 230 may comprise an enclosure having a front enclosure portion 232, a rear enclosure portion 234, and a carrier 236 (e.g., a button support structure). The electrical circuitry of the keypad 200 may be mounted to a printed circuit board (not shown), which may be located between the front enclosure portion 232 and the rear enclosure portion 234. The control module 230 may comprise a connector 242 that may allow the control module to be electrically connected to a power source and/or a wired communication link (e.g., digital communication link and/or an analog control link).

The buttons 220 may each comprise a cap portion 222, a flange portion 224, and an elongated portion 226. The elongated portion 226 of each button may be received in respective openings 238 of the carrier 236 of the control module 230. When the faceplate 210 is connected to the control module 230, the cap portion 222 of each of the buttons 220 may be received in the respective opening 212 of the faceplate 210. The flange portions 224 may cause the buttons 220 to be captured between the faceplate 210 and the control module 230. The faceplate 210 may comprise posts 216 that extend from the rear surface 215 of the faceplate 210, and may be received in openings 244 in the front enclosure portion 232. The faceplate 210 may be attached to the control module 230 via attachment screws 245 received through channels 246 in the rear enclosure portion 234 and openings 218 (e.g., threaded openings) in the posts 216 of the faceplate when the posts are located in the openings 244 of the front enclosure portion 232. When the faceplate 210 is attached to the control module 230 and the cap portion 222 of each button 220 is received in the respective opening 212 in the faceplate 210, the cap portion 222 of each button 220 may be actuated (e.g., pushed in towards the control module 230) to cause the elongated portion 226 of the button 220 to actuate mechanical switches inside the control module 230. For example, the mechanical switches of the control module 230 may each comprise a mechanical tactile switch package (not shown) mounted to the printed circuit board of the control module. In addition, the mechanical switches of the control module 230 may each comprise a deflectable dome (not shown) that may be similar to the deflectable dome 148 of the control module 130 shown in FIG. 7.

Figure 15:
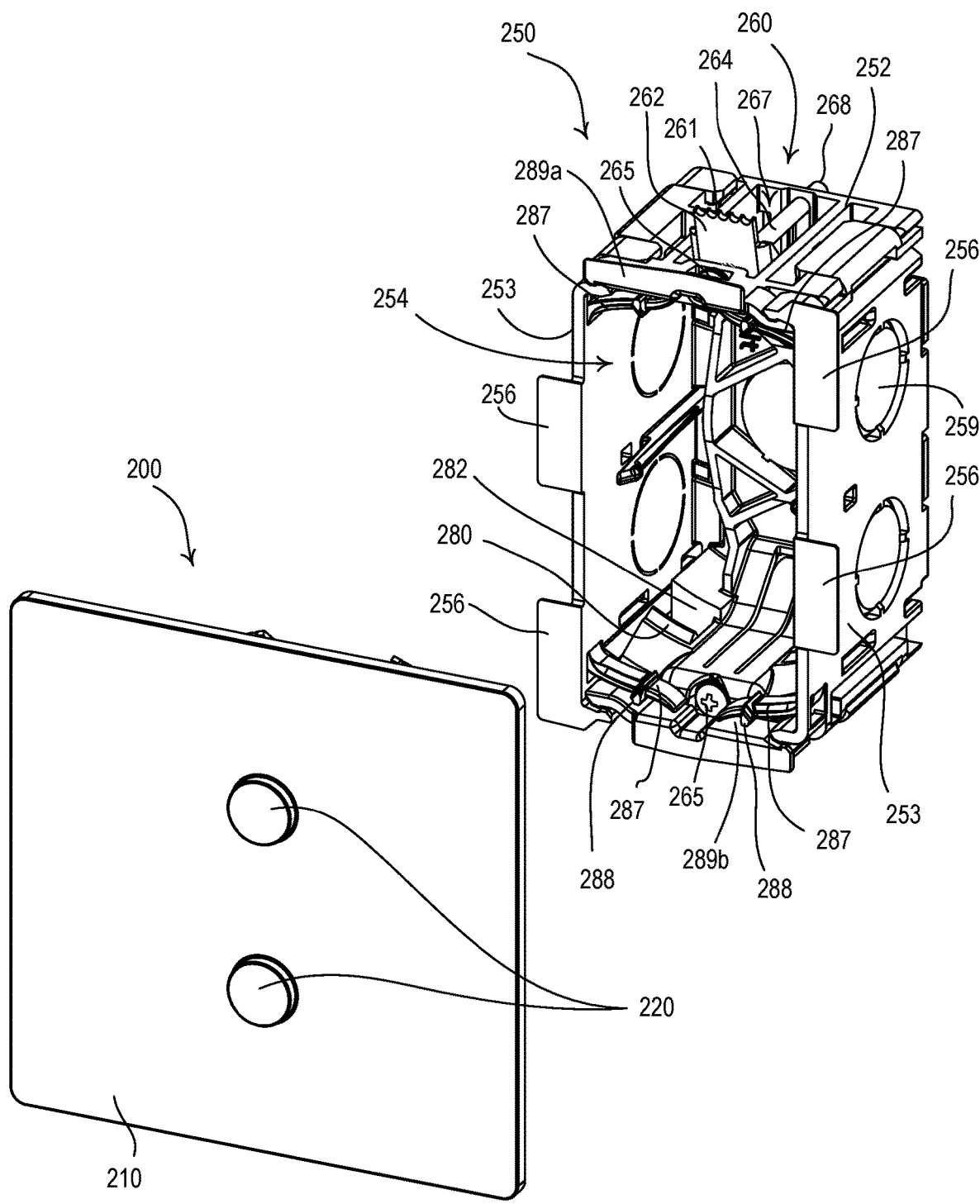
FIG. 15 is an example front exploded view showing the control device of FIG. 10 detached from a wall box.
Figure 16:
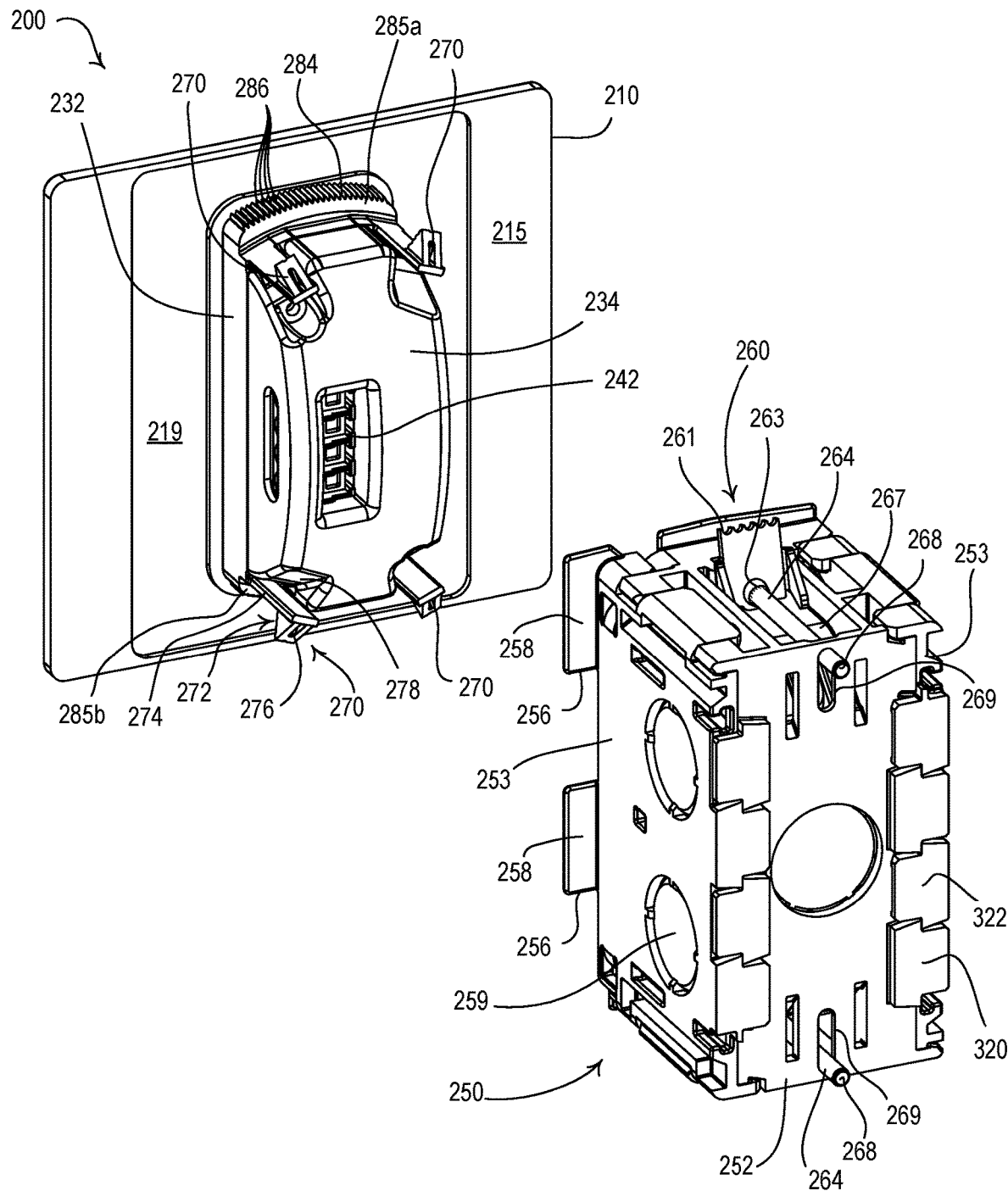
FIG. 16 is an example rear exploded view of the control device and wall box of FIG. 15.

FIG. 15 is an example front perspective view and FIG. 16 is an example rear perspective view showing the keypad 200 detached from the wall box 250. The wall box 250 may comprise a body having a center portion 252 and two side portions 253 that may be connected together to define a recess 254 in which the control module 230 of the keypad 200 (e.g., the enclosure of the control module) or another wall-mounted electrical device may be received. The wall box 250 may be configured to be inserted within an opening in a wall (e.g., such as drywall, plaster, wood paneling, etc.). The wall box 250 may further comprise flange portions 256 having respective rear surfaces 258 that may abut against the wall when the wall box 250 is inserted into the opening in the wall. When the keypad 200 is mounted to the wall box 250 and the faceplate 210 is attached to the control module 230, the flange portions 256 may be received in a recess 219 in the rear surface 215 of the faceplate so that the rear surface of the faceplate may sit against the wall (e.g., a space between the rear surface 215 of the faceplate 210 and the wall may be minimized and/or eliminated). The wall box 250 may include one or more knock-outs 259 that may be removed and/or partially removed to create openings in the wall box through which one or more electrical wires and/or communication wires (e.g., that may be connected to the connector 242 of the keypad 200) may extend.

The wall box 250 may include mounting clamps 260 (e.g., two mounting clamps) that may be used to mount the wall box 250 to the wall (e.g., in a similar manner as the mounting clamps 160 of the wall box 150). Each mounting clamp 260 may include a plate 261 defining a front surface 262 and a bore 263 running therethrough. The front surface 262 may be configured to abut the wall (e.g., the opposite wall surface than the flange portion 256 engages). The bore 263 of the plate 261 of each mounting clamp 260 may receive a respective mounting screw 264 and may be threaded onto the mounting screw 264. Each mounting screw 264 may have a head 265 that may be maintained at a location adjacent to the flange portion 256 (e.g., at the front) of the electrical wall box 250. Each mounting screw 264 may extend through a respective channel 267 that is formed in the center portion 252 of the wall box 250. Each mounting screw 264 may have a terminal end 268 opposite the head 265 that may be positioned in a slot 269 formed in the center portion 252 of the wall box 250. In addition, the wall box 250 may be mounted to (e.g., nailed to) a stud or other structure before the wall is installed. The wall box 250 may be installed and uninstalled in a similar manner as described above with reference to the wall box 150 (e.g., using the mounting clamps 160).

The keypad 200 may be configured to mount to (e.g., snap to) the wall box 250, for example, without using screws. The control module 230 may comprise snaps 270 configured to be snapped to tabs 280 of the wall box 250. For example, as shown in FIG. 16, the control module 230 may comprise four snaps 270 located adjacent to corners of the rear enclosure portion 234 of the control module 230. The snaps 270 may be configured to be received in openings 282 and engage the tabs 280 of the wall box 250 when the keypad 200 is inserted into the recess 254 of the wall box. The snaps 270 may each comprise an engagement surface 272 configured to engage the respective tab 280 of the wall box 250. The engagement surfaces 272 may each comprise a number of steps (not shown) that may engage the respective tab 280 to provide a number of different levels of insertion of the control module 230 into the recess 254 of the wall box 250 (e.g., depending upon how far the control module 230 is able to be inserted into the recess of the wall box). The snaps 270 may be connected (e.g., flexibly connected) to the front enclosure portion 232 of the control module 230 via arms 274.

As the keypad 200 is inserted into the recess 254 of the wall box 250, sloped surfaces 276 of the snaps 270 may push against the tabs 280. This may cause the arms 274 to flex forcing the snaps 270 into respective alcoves 278 (e.g., channels) formed in the rear enclosure portion 234 of the control module 230. When the snaps 270 move past the tabs 280 and are received in the openings 282, the arms 274 may return to their idle positions and the snaps 270 may engage the tabs 280 thus holding the keypad 200 inside of the recess 254 of the wall box 250. The keypad 200 may be removed from the wall box 250 by pulling the faceplate 210 away from the wall box 250 the engagement surfaces 272 of the snaps 270 may push against the respective tabs 280 until the arms 274 flex to force the arms 274 of the snaps 270 into the respective alcoves 278 thus allowing the control module 230 to exit the recess 254 of the wall box 250.

If the wall box 250 is installed in the opening in the wall at an angle when the keypad 200 is mounted to the wall box 250, the keypad 200 may also appear crooked on the wall, which may be an undesirable installation condition. The keypad 200 may be configured to move (e.g., rotate) within the recess 254 of the wall box 250, so that the alignment (e.g., angle) of the keypad 200 on the wall may be adjusted and the keypad 200 may be arranged substantially level. For example, the snaps 254 may be configured to slide along the respective tabs 280 in the respective openings 282 of the wall box 250 to allow the keypad 200 to rotate (e.g., the openings 282 may limit the amount of possible rotation of the keypad 200).

The front enclosure portion 232 of the control module 230 may define two notched surfaces 284 (e.g., ratchet surfaces). A first one of the notched surfaces 284 may be located at a top side 285a of the front enclosure portion 232 and a second one of the notched surfaces 284 may be located at a bottom side 285b of the front enclosure portion 232. Each notched surface 284 may have a plurality of detents 286. The wall box 250 may comprise flexible members 287 having respective projections 288 configured to be received in one of the detents 286 of the notched surfaces 284 when the keypad 200 is installed in the recess 254 of the wall box 250. For example, the wall box 250 may comprise two flexible members 287 having respective projections 288 at a top side 289a of the recess 254 of the wall box and two flexible members 287 having respective projection 288 at a bottom side 289b of the recess 254 of the wall box. The projections 288 at the top side 289a of the wall box 250 may be configured to engage the detents 286 of the notched surface 284 at the top side 285a of the control module 230. The projections 288 at the bottom side 289b of the wall box 250 may be configured to engage the detents 286 of the notched surface 284 at the bottom side 285b of the control module 230.

Figure 17:
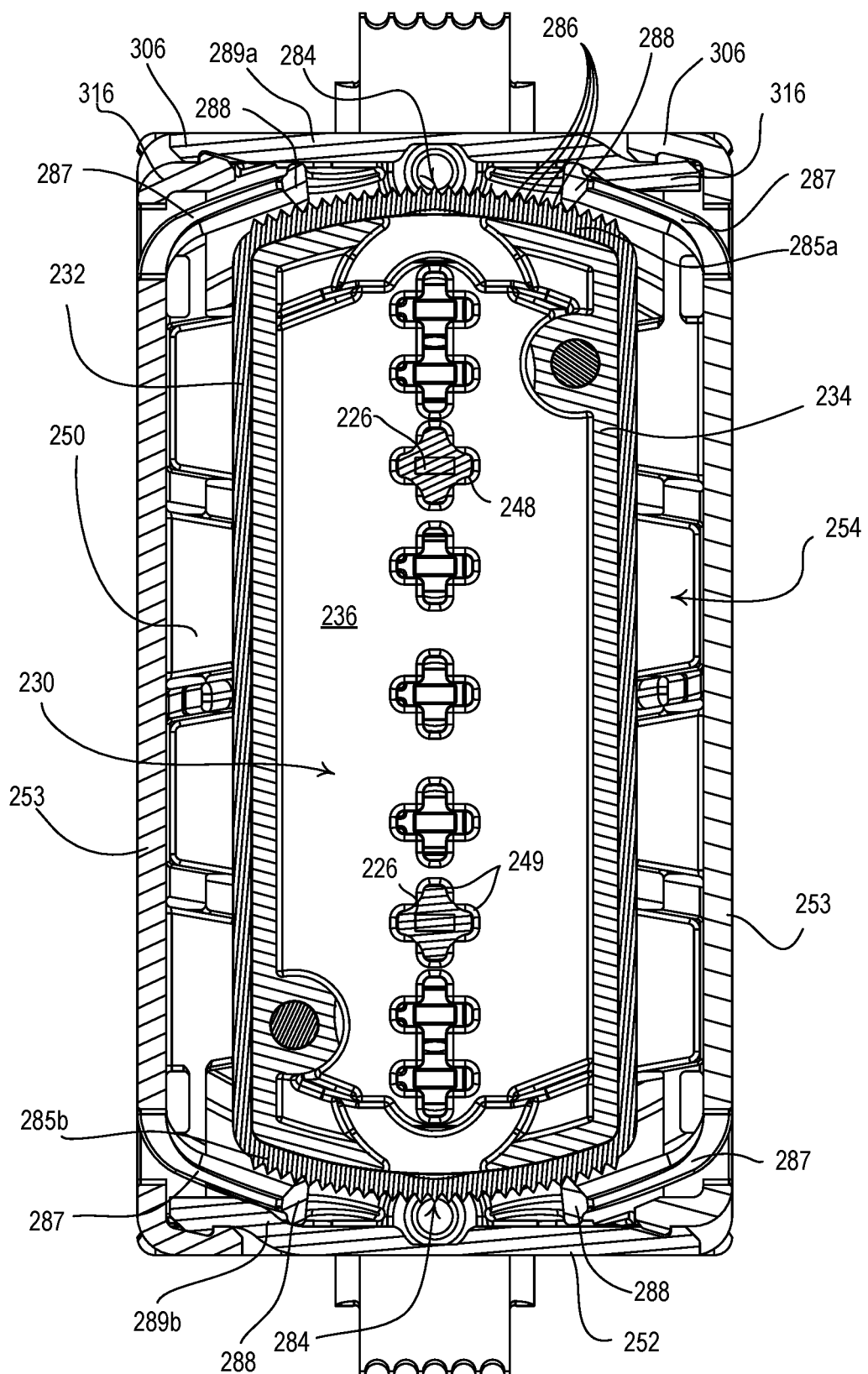
FIG. 17 is an example front cross-sectional view of the control device of FIG. 10 taken through the line shown in FIG. 12.

As the keypad 200 is being inserted into the wall box 250, the projections 288 may contact the front enclosure portion 232 of the control module 230 causing the flexible members 287 to flex towards the top and bottom sides 289a, 289b of the wall box 250 until the projections 288 come to rest in respective detents 286 of the notched surfaces 284. FIG. 17 is a front cross-sectional view of the keypad 200 installed in the wall box 250 (e.g., taken through the line shown in FIG. 12) showing how the projections 288 are received in the detents 286 of the notched surface 284. The flexible members 287 may each apply a force towards the front enclosure portion 232 to hold the projections 288 in the respective detents 286. When a rotational force is applied to the faceplate 210 of the keypad 200, the flexible members 287 may be configured to flex to allow the projections 288 to move into adjacent detents 286. The notched surfaces 284 may be curved to facilitate rotation of the keypad 200 in the wall box 250. For example, the snaps 270 may be configured to move through the openings 282 in the wall box 250 to provide approximately 6° of total rotation of the keypad 200.

Figure 18:
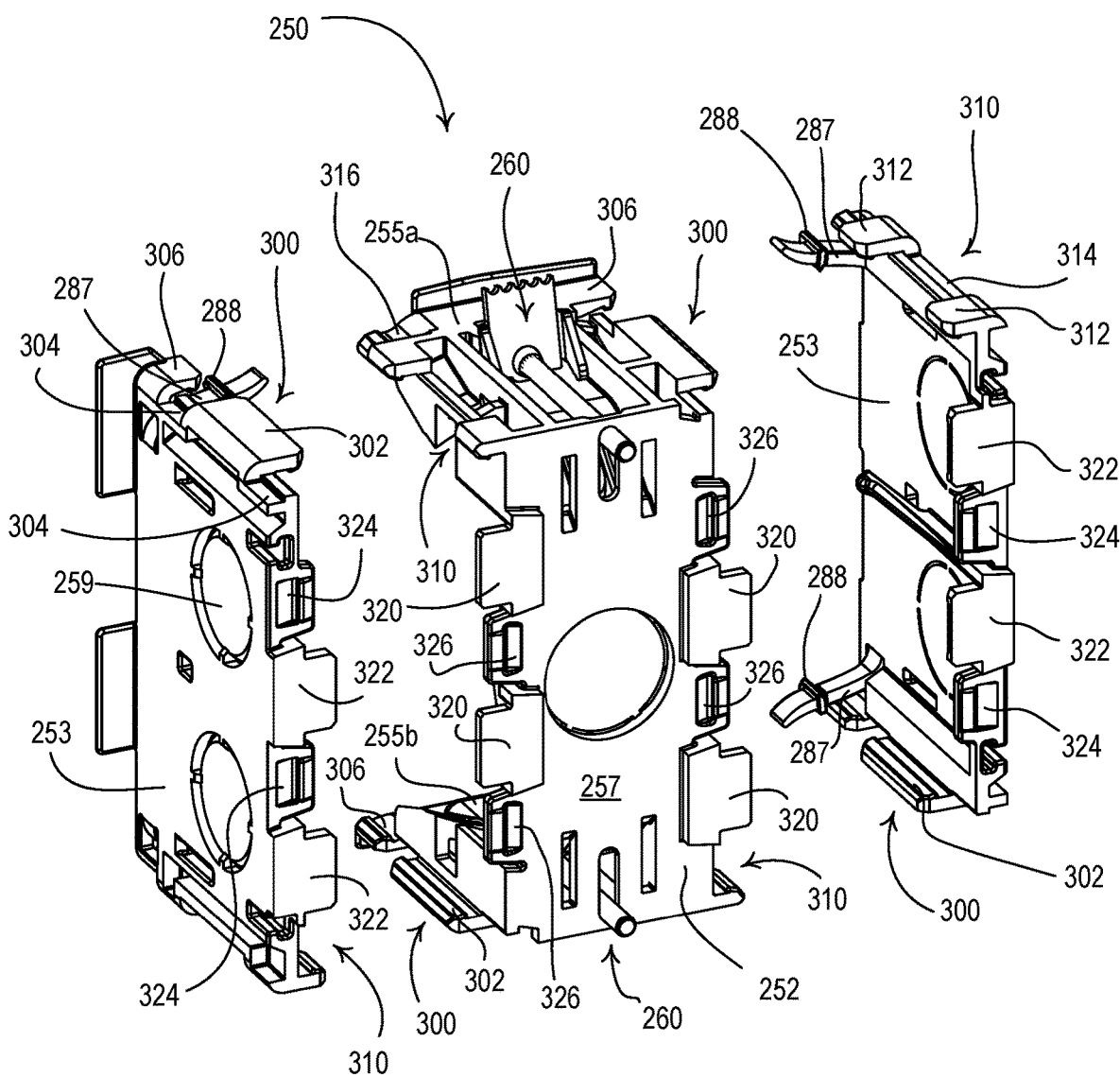
FIG. 18 is an example rear exploded view of the wall box of FIG. 15.

FIG. 18 is a rear exploded view of the wall box 250 without the keypad 200 shown. The wall box 250 may have a modular assembly and may be constructed from the center portion 252 and two side portions 253 (e.g., the portions may be attached together) at the time of installation of the wall box into the opening in the wall (e.g., in the field). The center portion 252 may define top and bottom sides 255a, 255b and a rear side 257 of the wall box 250. The side portions 253 may be identical and may define left and right sides of the wall box 250. The top and bottom sides 255a, 255b of the center portion 252 may include the mounting clamps 260 of the wall box 250. The flexible members 287 and the respective projections 288 may be formed as part of the side portions 253. Alternatively or additionally, the center portion may comprise flexible members and respective projections.

The center portion 252 and the side portions 253 may each comprise a number of attachment configurations (e.g., first attachment configurations 300) that are configured to be attached to complementary attachment configurations (e.g., second attachment configurations 194) on the center portion and the side portions. For example, each side portion 253 may comprise one of the first attachment configurations 300 and one of the second attachment configurations 310. The center portion 252 may comprise a set of the first and second attachment configurations 300, 310 (e.g., one of the first attachment configurations 300 and one of the second attachment configurations 310) on each side of the center portion. The first attachment configuration 300 of each of the side portions 253 may be configured to be attached to one of the second attachment configurations 310 of the center portion 252, and the second attachment configuration 300 of each of the side portion 253 may be configured to be attached to the corresponding first attachment configuration 310 of the center portion 252.

Each of the first and second attachment configurations 300, 310 may comprise a number of snaps and depressions. For example, each of the first attachment configurations 300 may include a large snap 302, a short snap 304, and two short depressions 306, and each of the second attachment configurations 310 may include two small snaps 312, a long depression 314, and a short depression 316. The snaps of each of the first and second attachment configurations 300 may be adapted to be received in the depressions of the complementary attachment configurations. For example, the large snap 302 of each first attachment configuration 300 may be configured to be received in the long depression 314 of each second attachment configuration 310. The short snap 304 of each first attachment configuration 310 may be configured to be received in the short depression 316 of each second attachment configuration 310. The small snaps 312 of each second attachment configuration 310 may be configured to be receive in the short depressions 306 of each first attachment configuration 300.

The center portion 252 may also comprise tabs 320 (e.g., interweaving tabs) configured to interweave with tabs 322 (e.g., interweaving tabs) of the side portions 253 when the side portions are connected to the center portion. Each tab 320 on the center portion 252 may comprise a respective snap (not shown) that may be located on a front surface of the tab and may be configured to be received in a respective depression 324 in the side portions 253. Each tab 322 on the side portions 253 may also comprise a respective snap (not shown) that may be located on a front surface of the tab and may be configured to be received in a respective depression 326 in the center portion 252.

Additional center portions 252 may be connected together to form a multiple-gang wall box. For example, a first center portion may be attached to a second center portion with a first side portion attached to the first center portion and a second side portion attached to the second center portion. Accordingly, any size wall box may be formed from these two unique parts, e.g., the center portion 252 and the side portion 253.

What is claimed is:

1. An apparatus comprising:
an electrical device having an enclosure; and
a wall box having a body defining a recess configured to receive the enclosure of the electrical device, the wall box further comprising a support frame having opposing planar portions oriented in a first plane and opposing spanning portions connected between the planar portions to define an opening of the support frame, the support frame configured to have the electrical device connected thereto;
wherein the support frame is configured to rotate in the first plane of the planar portions after the electrical device is connected to the support frame to allow for adjustment of the alignment of the electrical device after installation into the wall box, and
wherein the support frame comprises springs configured to squeeze sides of the enclosure of the electrical device when the electrical device is connected to the support frame to hold the electrical device in the recess of the wall box.

2. The apparatus of claim 1, wherein the electrical device comprises snaps configured to snap to the support frame.

3. The apparatus of claim 2, wherein each snap of the electrical device is flexibly connected to the enclosure via a respective arm, each arm configured to flex into a respective channel in the enclosure as the electrical device is inserted into the opening of the support frame.

4. The apparatus of claim 3, wherein the support frame comprises tabs, each tab of the support frame defines a front surface against which the respective snap of the enclosure pushes to flex the respective arm into the respective channel as the electrical device is inserted into the opening of the support frame.

5. The apparatus of claim 2, wherein the support frame comprises tabs to which the respective snaps of the electrical device engage to connect the electrical device to the support frame.

6. The apparatus of claim 5, wherein each snap of the electrical device comprises an engagement surface configured to engage the respective tab of the support frame, the engagement surface of each snap comprising a number of steps to provide a number of different levels of insertion of the electrical device into the recess of the body of the wall box.

7. The apparatus of claim 1, wherein the support frame is configured to be locked in place after the support frame is rotated to align the electrical device after installation.

8. The apparatus of claim 7, wherein the wall box further comprises a locking screw received through a slot in the support frame and having a terminal end received in the body of the wall box, the support frame configured to be rotated when the locking screw is loosened and locked in place when the locking screw is tightened.

9. The apparatus of claim 1, wherein the spanning portions of the support frame are oriented in a second plane perpendicular to the first place of the planar portions.

10. The apparatus of claim 9, wherein the spanning portions are configured to contact the enclosure of the electrical device when the electrical device is connected to the support frame to hold the electrical device in the recess of the wall box.

11. The apparatus of claim 1, wherein the support frame is located in the recess of defined by the body of the wall box, and the planar portions of the support frame are captured between parts formed in the body allowing the planar portions to slide between the parts.

12. The apparatus of claim 1, wherein the electrical device comprises a keypad having a faceplate and one or more buttons, the support frame configured to rotate to allow for alignment of the faceplate and buttons of the keypad.

13. A wall box for mounting an electrical device, the wall box comprising:
  a body defining a recess configured to receive an enclosure of the electrical device; and
  a support frame having opposing planar portions oriented in a first plane and opposing spanning portions connected between the planar portions to define an opening of the support frame, the support frame configured to have the electrical device connected thereto;
  wherein the support frame is configured to rotate in the first plane of the planar portions after the electrical device is connected to the support frame to allow for alignment of the electrical device after installation into the wall box, and
  wherein the support frame comprises springs configured to squeeze the enclosure of the electrical device when the electrical device is connected to the support frame to hold the electrical device in the recess of the wall box.

14. The wall box of claim 13, wherein the support frame is configured to be locked in place after the support frame is rotated to align the electrical device after installation.

15. The wall box of claim 14, further comprising:
  a locking screw received through a slot in the support frame and having a terminal end received in the body of the wall box;
  wherein the support frame is configured to be rotated when the locking screw is loosened and locked in place when the locking screw is tightened.

16. The wall box of claim 15, wherein the slot in the support frame is characterized by a curvature to facilitate rotation of the support frame.

17. The wall box of claim 13, wherein the spanning portions of the support frame are oriented in a second plane perpendicular to the first place of the planar portions.

18. The wall box of claim 17, wherein the spanning portions are configured to contact the enclosure of the electrical device when the electrical device is connected to the support frame to hold the electrical device in the recess of the wall box.

19. The wall box of claim 13, wherein the support frame is located in the recess of defined by the body of the wall box, and the planar portions of the support frame are captured between parts formed in the body allowing the planar portions to slide between the parts.

20. The wall box of claim 13, wherein the support frame comprises tabs to which the enclosure of the electrical device snaps to connect the electrical device to the support frame.

21. An apparatus comprising:
  an electrical device having an enclosure, the enclosure defining a notched surf ace that is curved and has a plurality of detents; and
  a wall box having a body defining a recess configured to receive the enclosure of the electrical device, the wall box further comprising at least one flexible member having a projection configured to be received in one of the detents of the notched surface when the electrical device is received in the recess of the body;
  wherein the electrical device is configured to be rotated after the electrical device is received in the recess of the body to allow for alignment of the electrical device after installation into the wall box, the flexible member of the wall box configured to flex as the electrical device is rotated to allow the projection to be received in other ones of the plurality of detents of the notched surface.

22. The apparatus of claim 21, wherein the electrical device comprises snaps configured to snap to respective tabs of the wall box.

23. The apparatus of claim 22, wherein each snap of the electrical device is flexibly connected to the enclosure via a respective arm, each arm configured to flex into a respective channel in the enclosure as the electrical device is inserted into the recess of the wall box.

24. The apparatus of claim 23, wherein each snap comprises a respective sloped surface configured to contact the respective tab of the wall box to cause the respective arm to flex into the respective channel as the electrical device is inserted into the recess of the wall box.

25. The apparatus of claim 22, wherein the snaps of the electrical device are configured to be received in respective openings of the wall box when the electrical device is inserted into the recess of the wall box, the snaps configured to move through the openings as the electrical device is rotated.

26. The apparatus of claim 25, wherein the openings are configured to limit the amount of possible rotation of the electrical device.

27. The apparatus of claim 22, wherein each snap of the electrical device comprises an engagement surface configured to engage the respective tab of the wall box, the engagement surface of each snap comprising a number of steps to provide a number of different levels of insertion of the electrical device into the recess of the body of the wall box.

28. The apparatus of claim 21, wherein the electrical device comprises a first notched surf ace at a top side of the enclosure and a second notched surf ace at a bottom side of the enclosure.

29. The apparatus of claim 28, wherein the wall box comprises two flexible members having respective projections at a top side of the wall box and two flexible members having respective projections at a bottom side of the wall box, the projections at the top side of the wall box configured to engage respective detents of the notched surface at the top side of the enclosure, the projections at the bottom side of the wall box configured to engage respective detents of the notched surface at the bottom side of the enclosure.

30. The apparatus of claim 21, wherein the flexible member is configured to apply a force towards the enclosure to hold the projection in the respective detent of the notched portion.

31. The apparatus of claim 21, wherein the projection is configured to contact the enclosure causing the flexible member to flex as the electrical device is inserted into the recess of the wall box.

32. The apparatus of claim 21, wherein the electrical device comprises a keypad having a faceplate and one or more buttons, the keypad configured to rotate in the wall box to allow for alignment of the faceplate and buttons of the keypad.

33. An electrical device configured to be mounted to a wall box, the electrical device comprising:
  an enclosure defining a notched surface that is curved and has a plurality of detents, each of the plurality of detents of the notched surface configured to receive a projection of the wall box;
  wherein the electrical device is configured to be rotated after the electrical device is inserted into a recess of the wall box to allow the projection of the wall box to be received in other ones of the plurality of detents of the notched surface, the electrical device configured to be rotated to allow for alignment of the electrical device after installation into the wall box.

34. The electrical device of claim 33, further comprising:
one or more snaps configured to snap to the wall box, each snap flexibly connected to the enclosure via a respective arm, each arm configured to flex into a respective channel in the enclosure as the electrical device is inserted into the recess of the wall box.

35. The electrical device of claim 34, wherein each snap of the electrical device comprises an engagement surface configured to engage a respective tab of the wall box, the engagement surface of each snap comprising a number of steps to provide a number of different levels of insertion of the electrical device into the recess of the body of the wall box.

36. The electrical device of claim 34, wherein each snap comprises a respective sloped surface configured to contact a respective tab of the wall box to cause the respective arm to flex into the respective channel as the electrical device is inserted into the recess of the wall box.

37. The electrical device of claim 33, further comprising:
one or more buttons configured to be actuated, the electrical device configured to control an electrical load in response to an actuation of the one of the buttons;
wherein the electrical device is configured to be rotated to allow for alignment of the buttons.

38. The electrical device of claim 37, further comprising:
a faceplate having one or more openings for receiving the respective buttons of the electrical device;
wherein the electrical device is configured to be rotated to allow for alignment of the faceplate and buttons.

39. The electrical device of claim 33, wherein the enclosure defines a first notched surface at a top side of the enclosure and a second notched surface at a bottom side of the enclosure, each of the plurality of detents of the first notched surface configured to receive a first projection of the wall box, each of the plurality of detents of the second notched surface configured to receive a second projection of the wall box.

40. A wall box for mounting an electrical device, the wall box comprising:
a body defining a recess configured to receive an enclosure of the electrical device; and
at least one flexible member having a projection configured to be received in a detent of a notched surface in the enclosure of the electrical device when the electrical device is received in the recess of the body;
wherein the electrical device is configured to be rotated after the electrical device is received in the recess of the body to allow for alignment of the electrical device after installation into the wall box, the flexible member of the wall box configured to flex as the electrical device is rotated to allow the projection to be received in other ones of detents of the notched surface in the enclosure of the electrical device.

41. The wall box of claim 40, wherein the body comprises a top side and a bottom side, the wall box comprising at least one two flexible member having a respective projection at the top side of the body and at least one flexible member having a respective projection at the bottom side of the body, the at least one projection at the top side of the body configured to engage detents of a first notched surface at a top side of the enclosure of the electrical device, the at least one projection at the bottom side of the body configured to engage detents of a second notched surface at a bottom side of the enclosure of the electrical device.

42. The wall box of claim 41, wherein the wall box comprises two flexible members having respective projections at the top side of the body and two flexible members having respective projections at the bottom side of the body, the projections at the top side of the body configured to engage the detents of the first notched surface at the top side of the enclosure of the electrical device, the projections at the bottom side of the body configured to engage the detents of the second notched surface at the bottom side of the enclosure of the electrical device.

43. The wall box of claim 42, wherein the body of the wall box comprises a center portion and two identical side portions configured to be connected to the center portion, the flexible members and respective projections formed as part of the side portions.

44. The wall box of claim 43, wherein each side portion comprises a first attachment configuration and a second attachment configuration, and the center portion comprises one of the first attachment configurations and one of the second attachment configurations on each side of the center portion, the first attachment configurations of each of the side portions configured to be attached to one of the second attachment configurations of the center portion, the second attachment configurations of each of the side portions configured to be attached to one of the first attachment configurations of the center portion.

45. The wall box of claim 40, further comprising:
tabs to which the enclosure of the electrical device snaps to connect the electrical device to the wall box.

46. The wall box of claim 40, further comprising:
openings configured to receive respective snaps of the enclosure of the electrical device when the enclosure of the electrical device is received in the recess of the body;
wherein the openings are configured to limit the amount of possible rotation of the electrical device.

47. The wall box of claim 40, wherein the flexible member is configured to apply a force towards the enclosure of the electrical device to hold the projection in the respective detent of the notched portion.

48. The wall box of claim 40, wherein the projection is configured to contact the enclosure causing the flexible member to flex as the electrical device is inserted into the recess of the wall box.

* * * * *